(12) United States Patent
Luh et al.

(10) Patent No.: US 8,368,119 B1
(45) Date of Patent: Feb. 5, 2013

(54) INTEGRATED STRUCTURE WITH TRANSISTORS AND SCHOTTKY DIODES AND PROCESS FOR FABRICATING THE SAME

(75) Inventors: Louis Luh, Sunnyvale, CA (US); Keh-Chung Wang, Thousand Oaks, CA (US); Wah S. Wong, Montebello, CA (US); Miroslav Micovic, Thousand Oaks, CA (US); David Chow, Newbury Park, CA (US); Don Hitko, Grover Beach, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/111,771

(22) Filed: May 19, 2011

Related U.S. Application Data

(62) Division of application No. 11/853,694, filed on Sep. 11, 2007, now Pat. No. 7,989,277.

(51) Int. Cl.
*H01L 29/66* (2006.01)

(52) U.S. Cl. .................. 257/192; 257/194; 257/E31.065

(58) Field of Classification Search .................. 257/192, 257/194, 199, 183, E31.065, E21.047
See application file for complete search history.

(56) References Cited

U.S. PATENT DOCUMENTS

| | | | |
|---|---|---|---|
| 7,098,490 B2 | 8/2006 | Micovic et al. | |
| 2003/0116782 A1 | 6/2003 | Mizutani | 257/183 |
| 2003/0235974 A1 | 12/2003 | Martinez et al. | 438/555 |
| 2010/0159664 A1 | 6/2010 | Gluschenkov et al. | 438/312 |

OTHER PUBLICATIONS

Dang, G., et al., "High voltage GaN Schottky Rectifiers," IEEE Trans. on Electronic Devices, vol. 47, No. 4, Apr. 2000.

*Primary Examiner* — Chuong A Luu
*Assistant Examiner* — Nga Doan
(74) *Attorney, Agent, or Firm* — Ladas & Parry

(57) ABSTRACT

A process for fabricating an integrated group III nitride structure comprising high electron mobility transistors (HEMTs) and Schottky diodes, and the resulting structure, are disclosed. Integration of vertical junction Schottky diodes is enabled, and the parasitic capacitance and resistance as well as the physical size of the diode are minimized. A process for fabricating an integrated group III nitride structure comprising double-heterostructure field effect transistors (DHFETs) and Schottky diodes and the resulting structure are also disclosed.

13 Claims, 4 Drawing Sheets

| Layer | Thickness (Angstroms) |
|---|---|
| Fourth Intermediate | 100 - 1000 |
| Third Intermediate | 100 - 1000 |
| Etch Stop | 100 - 200 |
| Second Intermediate | 50 - 500 |
| First Intermediate | 50 - 500 |
| Second Spacer | 50 - 500 |
| Donor | 3 - 100 |
| First Spacer | 15 - 200 |

FIG. 4

INTEGRATED STRUCTURE WITH TRANSISTORS AND SCHOTTKY DIODES AND PROCESS FOR FABRICATING THE SAME

This is a divisional application of U.S. patent application Ser. No. 11/853,694, filed on Sep. 11, 2007, which is incorporated herein as though set forth in full.

BACKGROUND

1. Field

The present disclosure relates generally to transistors, diodes and fabrication processes for transistors and diodes. More particularly, it relates to an integrated structure comprising transistors, either high electron mobility or double-heterostructure field effect, and Schottky diodes and a process for fabricating the same.

2. Description of the Related Art

Gallium-Nitride (GaN) microwave monolithic integrated circuit (MMIC) high-electron-mobility-transistor (HEMT) technology has the advantages of high breakdown voltage, high operation temperature, high operation speed and a potentially high degree of integration. Such technology can be used for high-voltage, high-temperature, or high-radiation applications, including automotive, aviation and aerospace systems. Applications requiring high breakdown voltages, such as DC-to-DC switching power supplies, can be implemented with the GaN integrated circuit process.

However, the gate/source Schottky diode (one of the key components used in digital, analog or mixed-mode circuit) in the existing GaN HEMT process suffers from excessive parasitic capacitance and resistance due to its lateral junction structure, and non-ideal semiconductor layer structure. This parasitic capacitance and resistance leads to lower operation speed, lower gain, higher power consumption, and larger physical size. The non-ideal larger structure also leads to large and variable non-ideality factors in the Schottky diode I-V characteristics. Schottky diodes are semiconductor diodes with a low forward voltage drop and a very fast switching action. They are well known to the person skilled in the art and will not be described here in detail.

FIG. 1 shows a mesa structure obtained in accordance with a prior art GaN MMIC HEMT process. The structure comprises a plurality of HEMTs 20 separated by isolation elements 30. The HEMTs 20 share a substrate 1, for example a semi-insulating SiC substrate.

Each HEMT 20 comprises an undoped (i.e. unintentionally doped) semiconductor layer 2, e.g. a GaN buffer layer having a bandgap that is less than the band gap of semiconductor layer 5 later described. Within the undoped layer 2 there is generated a two-dimensional electron gas 3 in the structure, which forms the HEMT transistor channel. An undoped 'spacer' semiconductor layer 4 is disposed on top of the undoped layer 2 to further enhance the carrier mobility in the two-dimensional electron gas 3. The spacer layer 4 can be made of $Al_{0.25}Ga_{0.75}N$. The Al mole fraction of any $Al_xGa_{1-x}N$ layer could typically be in the range of 0.15 to 0.40.

The embodiment shown in FIG. 1 may also comprise a donor semiconductor layer 5 having a band gap and be optionally doped with a charge carrier (e.g., an N-type dopant in the form of silicon). Usually the donor layer 5 is made of $Al_{0.25}Ga_{0.75}N$.

An undoped spacer layer is deposited on top of the donor layer 5. It can be made of $Al_{0.25}Ga_{0.75}N$. If the donor layer 5 is undoped, then two spacer layers 4, 6 and the donor layer 5 can be formed as one contiguous spacer layer 4, 5, 6.

A source ohmic contact 7 and drain ohmic contact 8 are formed on top of the structure. The first cap layers 9, 10 are placed as to avoid direct contact between the ohmic contacts 7, 8 and the spacer layer 6. The first cap layers 9, 10 can be made of N+ doped GaN. (N+ doping is typically considered to be in the range of 1E17 to 1E19 $cm^{-3}$; doping in the range of 0 to 1E18 $cm^{-3}$ is typically considered N−.) The structure also comprises second cap layers 11, 12, which can be made of N+ doped $Al_{0.25}Ga_{0.75}N$.

An e-beam resist 13 is formed on the structure, and a metallic gate 14 is evaporated into a gate pattern formed by the resist 13. The voltage on gate 14 controls the two-dimensional electron gas 3.

A Schottky diode can be formed in the structure shown in FIG. 1. In particular, the drain and source terminals 7, 8 are shorted together as the cathode of the diode. The gate terminal 14 forms the anode of the diode. When operating as a Schottky diode, formation of the diode occurs by way of the junction between gate 14 and channel layer 6 and the currents flow laterally in layer 6 from the diode junction to the cathode.

While the undoped layer 6 provides for high carrier mobility underneath the gate 14, the low carrier concentration leads to a high series resistance between the gate 14 and the cathode contact 7, 8, resulting in increased loss in switching and level shifting applications. With this conventional gate Schottky structure, reductions in this resistance can only be achieved with wider devices, a one-for-one trade-off between the resistance and parasitic capacitance that ultimately limits the switching speed of the diode.

An added problem resulting from the high resistivity of the channel layer 6 is that of a "current crowding" when the gate Schottky is forward-biased. A lateral I•R voltage drop along the channel results in the middle of the gate Schottky diode being less forward-biased than the edges, so that there is more current conduction along the edges of the diode than in the middle. Thus, beyond a certain point, increasing the channel length to increase the diode area will not appreciably affect the current-handling capability of the diode. Once again, the only alternative is to increase the device width, leading to a trade-off between parasitic capacitance and current handling capability—a second key limitation of the conventional gate Schottky diode.

Therefore, the Schottky diode (one of the key components used in digital, analog, or mixed-mode circuits) in the existing GaN MMIC HEMT process suffers from excessive parasitic capacitance and resistance due to its lateral junction structure. This parasitic capacitance and resistance lead to lower operation speed, lower gain, higher power consumption, and larger physical size.

Another prior art structure is shown in Gerard T. Dang at al, "High Voltage GaN Schottky Rectifiers", IEEE Trans. On Electron Devices, Vol. 47, No. 4, April 2000. The Schottky diode process described by Dang at al. does not integrate GaN HEMT transistors on the same wafer.

The GaN MMIC HEMT process was designed for microwave and millimeter-wave amplifier applications. Integration levels for microwave amplifiers are not very high (e.g., 2 to 4 HEMT transistors). As the integration complexity of GaN HEMT integrated circuits becomes higher, the performance of Schottky diodes (as voltage shifters and rectifiers) becomes more important. There is a need for high performance Schottky diodes to make GaN HEMTs more competitive.

SUMMARY

A process for fabricating an integrated group III nitride structure comprising high electron mobility transistors (HEMTs) and Schottky diodes, and the resulting structure, are disclosed. Integration of vertical junction Schottky diodes is enabled, and the parasitic capacitance and resistance as well as the physical size of the diode are minimized. A process for fabricating an integrated group III nitride structure comprising double-heterostructure field effect transistors (DHFETs) and Schottky diodes and the resulting structure are also disclosed.

In particular, the present disclosure shows a new mesa structure which can be integrated with existing GaN MMIC HEMT or DHFET processes. The new mesa structure enables the integration of vertical junction Schottky diodes, thus minimizing the parasitic capacitance and resistance as well as the physical size of the diode. Assuming same current handling capacity, the GaN Schottky diode according to the present disclosure has 75% less parasitic resistance and 80% less parasitic capacitance when compared to the current lateral GaN Schottky diode. The diode according to the present disclosure may lead to a 20 times improvement in the RC time constant.

According to a first aspect of the present disclosure, a process for fabricating an integrated group III nitride structure of transistors (e.g. HEMTs or DHFETs) and Schottky diodes is provided, the process comprising: providing semiconductor layers, comprising: providing a group III nitride compound first intermediate layer; providing a group III nitride compound second intermediate layer above the first intermediate layer; providing a group III nitride compound etch stop layer above the second intermediate layer; providing a group III nitride compound third intermediate layer above the etch stop layer; providing a group III nitride compound fourth intermediate layer above the third intermediate layer; fabricating at least one transistor, comprising removing portions of said semiconductor layers; and fabricating at least one Schottky diode, comprising removing portions of said semiconductor layers.

The first aspect of the present disclosure may further comprise: providing a group III nitride compound first spacer semiconductor layer below the first intermediate layer and providing a group III nitride compound buffer semiconductor layer below the first spacer semiconductor layer; wherein said fabricating at least one transistor is fabricating at least one high electron mobility transistor (HEMT).

The first aspect of the present disclosure may further comprise in fabricating at least one HEMT: removing the fourth intermediate layer, third intermediate layer and etch stop layer; providing source and drain contacts on the second intermediate layer; and providing a gate contact on the first spacer semiconductor layer.

The first aspect of the present disclosure may further comprise: providing a group III nitride compound barrier layer below the first intermediate layer; providing a group III nitride compound channel layer below the barrier layer; providing a group III nitride compound buffer layer below the channel layer; and providing a group III nitride compound nucleation semiconductor layer below the buffer layer; wherein said fabricating at least one transistor is fabricating at least one double-heterostructure field effect transistor (DHFET).

The first aspect of the present disclosure may further comprise in fabricating at least one DHFET: removing the fourth intermediate layer, third intermediate layer and etch stop layer; providing source and drain contacts on the second intermediate layer; and providing a gate contact on the barrier layer.

According to a second aspect of the present disclosure, an integrated group III nitride structure comprising transistors (e.g. HEMTs or DHFETs) and Schottky diodes is provided, wherein the structure comprises: at least one transistor and at least one Schottky diode, wherein the at least one transistor comprises: a group III nitride compound first intermediate layer and a group III nitride compound second intermediate layer above the first intermediate layer, and wherein the at least one Schottky diode comprises: the group III nitride compound first intermediate layer, the group III nitride compound second intermediate layer, a group III nitride compound etch stop layer above the second intermediate layer; a group III nitride compound third intermediate layer above the etch stop layer; and a group III nitride compound fourth intermediate layer above the third intermediate layer.

The second aspect of the present disclosure may further comprise a group III nitride compound first spacer semiconductor layer below the first intermediate layer and a group III nitride compound buffer semiconductor layer below the first spacer semiconductor layer; wherein said at least one transistor is at least one high electron mobility transistor (HEMT).

The second aspect of the present disclosure may further comprise in at least one HEMT: a source contact on the second intermediate layer; a drain contact on the second intermediate layer; and providing a gate contact on the first spacer semiconductor layer.

The second aspect of the present disclosure may further comprise: a group III nitride compound barrier layer below the first intermediate layer; a group III nitride compound channel layer below the barrier layer; a group III nitride compound buffer layer below the channel layer; and a group III nitride compound nucleation semiconductor layer below the buffer layer; wherein said at least one transistor is at least one double-heterostructure field effect transistor (DHFET).

The second aspect of the present disclosure may further comprise in at least one DHFET: a source contact on the second intermediate layer; a drain contact on the second intermediate layer; and providing a gate contact on the barrier layer.

The steps recited in the process claims can also be performed in a sequence which is different from the sequence recited in the claims. All different sequences of steps are intended to be covered by the language of the appended claims.

The present disclosure will be best understood from the following description when read in conjunction with the accompanying drawings.

BRIEF DESCRIPTION OF THE DRAWINGS

FIG. 4 is a table of examples of ranges of layer thicknesses for the HEMT/Schottky diode structure.

DETAILED DESCRIPTION

Figure 2:
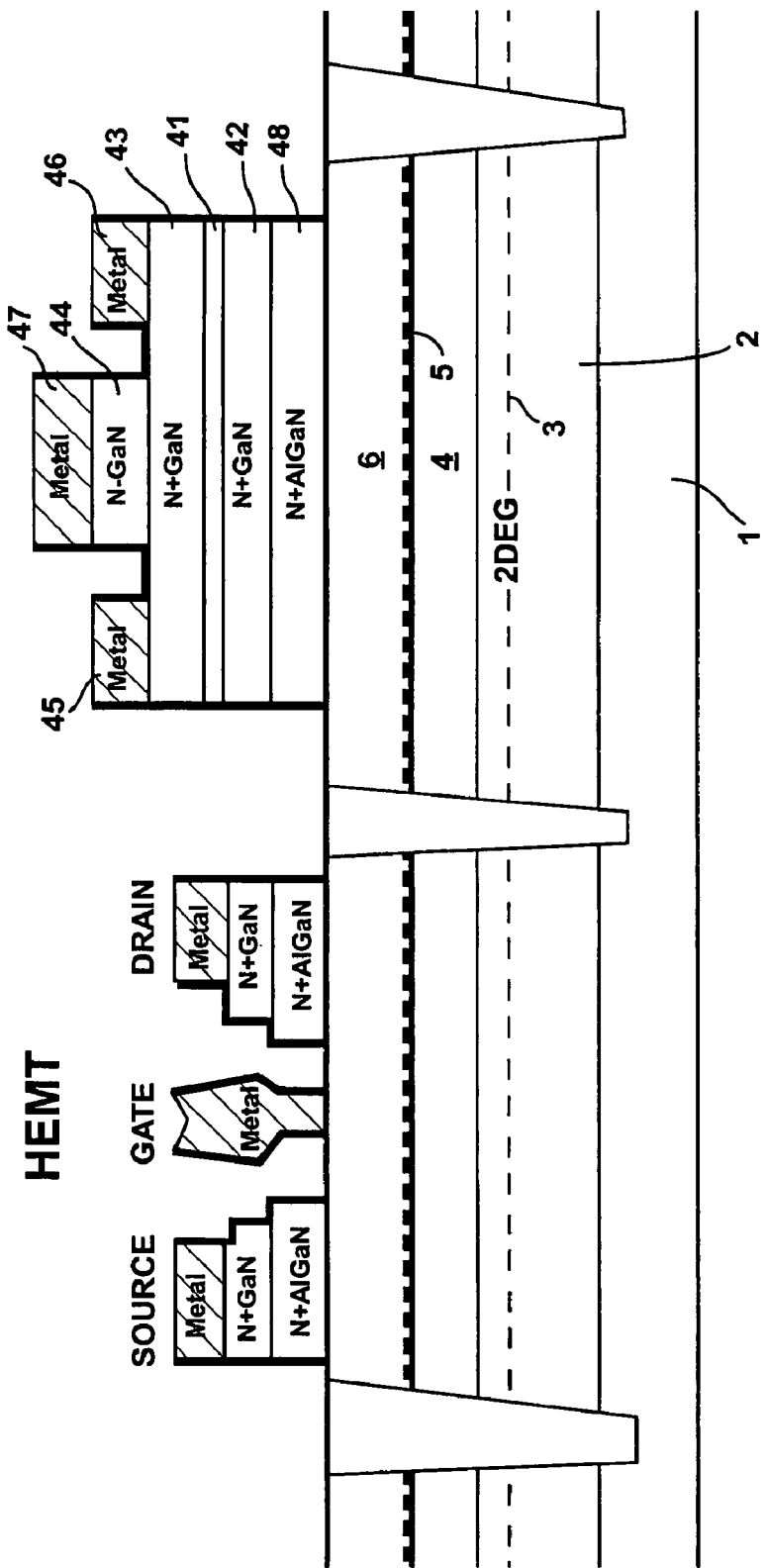
FIG. 2 is a cross sectional view of an integrated HEMT/Schottky diode structure in accordance with an embodiment of the present disclosure and a process for obtaining the same.

FIG. 2 shows an improved process and an improved integrated Schottky structure in accordance with the present disclosure.

Figure 1:
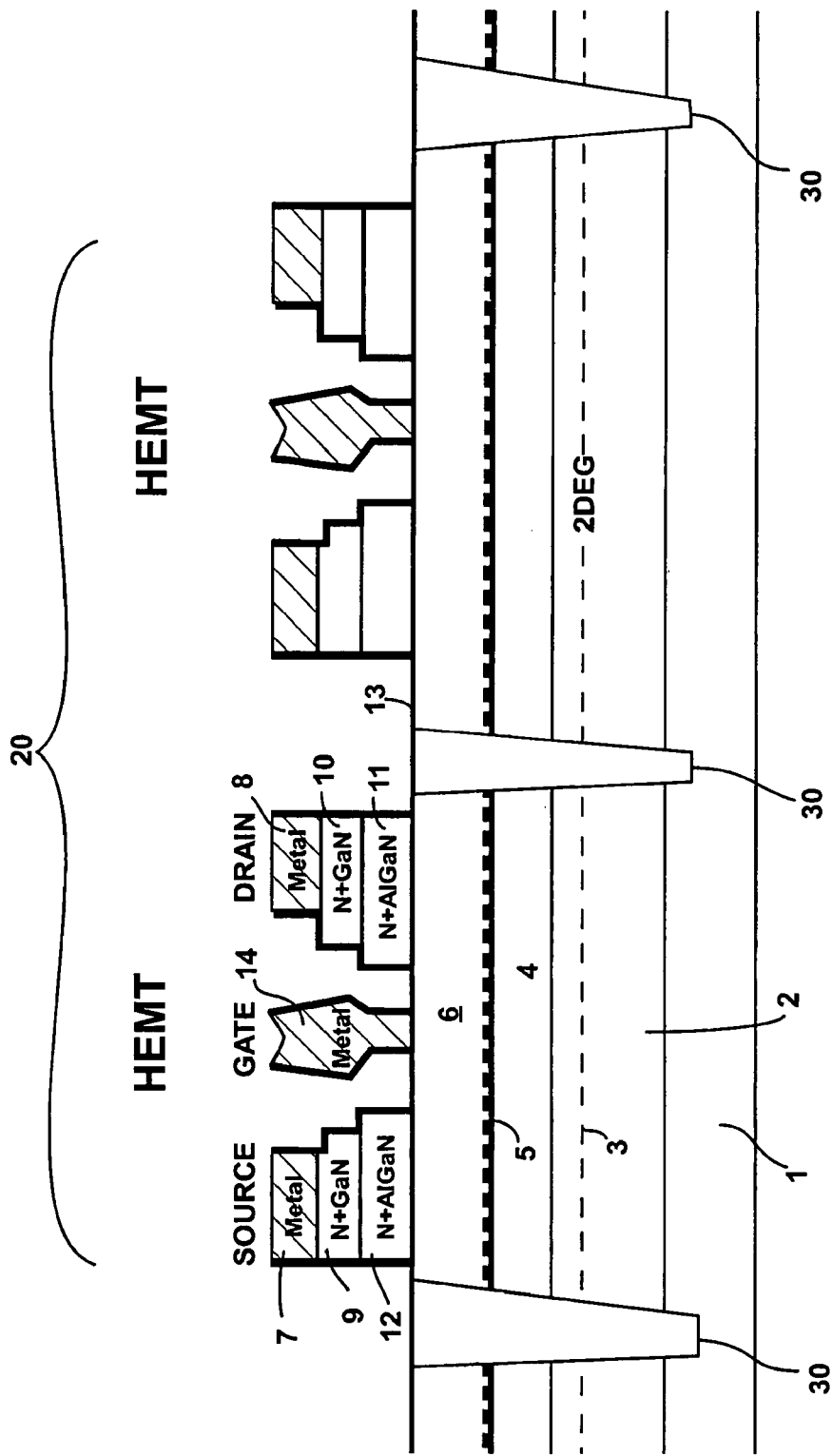
FIG. 1, already described in detail, is a cross sectional view of a prior art integrated HEMT/Schottky diode structure.

The HEMT depositing is performed as per the prior art, depositing a first intermediate layer 11, 12, 48 of N+ doped AlGaN and a second intermediate layer 9, 10, 42 of N+ GaN. An AlN etch stop layer 41 is formed above the N+ doped GaN "cap" layer 42 from which cap layers 9, 10 of the HEMT shown in FIG. 1 and on the left side of FIG. 2 are formed. A third intermediate layer, or second N+ doped GaN layer, 43 is formed on top of the AlN etch stop layer 41 to form the back side (cathode) contact to the diode. The fourth intermediate layer, an N– doped GaN layer 44 is formed in the gate region. Cathode metals 45, 46 are put on top of the second N+ doped GaN layer 43, while anode metal 47 is put above the N– doped GaN layer 44. The thickness and doping level of the N– doped GaN layer 44 are controllable and can be optimized for diode performance.

In areas where the Schottky diodes are not being formed, selective etching between GaN layer 42 and AlN layer 41 may be used to remove the three top layers 41, 43, 44 to expose the original HEMT device layer stack. Gate and ohmic metallization steps can then be performed to simultaneously form the contacts to the HEMT transistors and Schottky diodes.

Figure 3:
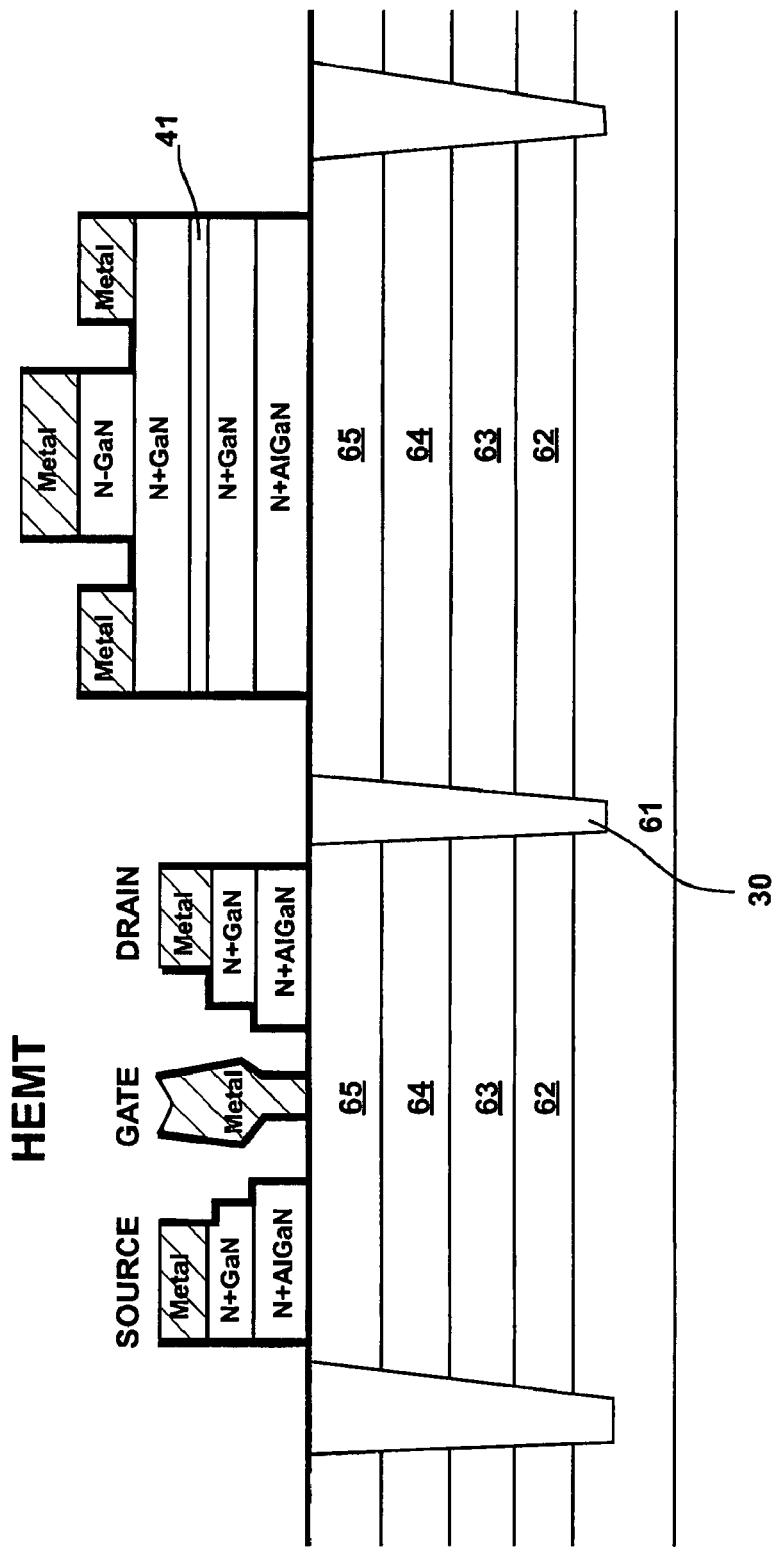
FIG. 3 is a cross sectional view of an integrated Schottky diode structure deposited on a DHFET structure in accordance with a further embodiment of the present disclosure and a process for obtaining the same.

FIG. 3 shows an improved process and an improved integrated Schottky structure deposited on a DHFET structure. A possible DHFET structure is described in U.S. Pat. No. 7,098,490, incorporated by reference in the present application, and comprises a substrate 61 (for example, SiC), an AlGaN nucleation layer 62, an $Al_xGa_{1-x}N$ buffer layer 63, a N+ doped GaN channel layer 64, and a barrier layer 65. The nucleation layer 62 provides a crystallographic transition between the substrate 61 and the buffer layer 63, which may have different crystal structures. The channel layer 64 should have little effect on the Schottky diode other than perhaps reducing the series resistance.

FIG. 4 is a table of example thickness ranges for an HFET/Schottky embodiment. The thicknesses of the etch stop and intermediate layers could also be applied to a DHFET/Schottky embodiment.

While several illustrative embodiments of the invention have been shown and described, numerous variations and alternative embodiments will occur to those skilled in the art. Such variations and alternative embodiments are contemplated, and can be made without departing from the spirit and scope of the invention as defined in the appended claims.

The invention claimed is:

1. An integrated group III nitride structure of transistors and Schottky diodes comprising:
   at least one transistor and at least one Schottky diode,
   wherein the at least one transistor comprises:
      a group III nitride compound first intermediate layer and
      a group III nitride compound second intermediate layer above the first intermediate layer, and
   wherein the at least one Schottky diode comprises:
      the group III nitride compound first intermediate layer,
      the group III nitride compound second intermediate layer,
      a group III nitride compound etch stop layer above the second intermediate layer;
      a N+ doped group III nitride compound third intermediate layer above the etch stop layer; and
      a N– doped group III nitride compound fourth intermediate layer above the third intermediate layer.

2. The structure of claim 1, wherein:
   the first intermediate layer comprises aluminum gallium nitride (AlGaN) and
   the second intermediate layer comprises gallium nitride (GaN).

3. The structure of claim 2, wherein:
   the first intermediate layer comprises N+ doped AlGaN and
   the second intermediate layer comprises N+ doped GaN.

4. The structure of claim 1, wherein:
   the etch stop layer comprises aluminum nitride (AlN);
   the third intermediate layer comprises gallium nitride (GaN); and
   the fourth intermediate layer comprises gallium nitride (GaN).

5. The structure of claim 4, wherein:
   the third intermediate layer comprises N+ doped GaN and
   the fourth intermediate layer comprises N– doped GaN.

6. The structure of claim 1, wherein the Schottky diodes further comprise:
   cathode metal contacts on the third intermediate layer and an anode metal contact on the fourth intermediate layer,
   wherein a thickness and a doping level of the fourth intermediate layer are configured for diode performance.

7. The structure of claim 1, further comprising:
   a group III nitride compound first spacer semiconductor layer below the first intermediate layer and
   a group III nitride compound buffer semiconductor layer below the first spacer semiconductor layer;
   wherein said at least one transistor IS at least one high electron mobility transistor (HEMT).

8. The structure of claim 7, further comprising:
   a group III nitride compound doped donor semiconductor layer above the first spacer semiconductor layer and
   a second group III nitride compound second spacer semiconductor layer above the donor semiconductor layer and below the first intermediate layer.

9. The structure of claim 8, wherein:
   the buffer semiconductor layer comprises gallium nitride (GaN);
   the first and second spacer semiconductor layers comprise aluminum gallium nitride (AlGaN); and
   the donor layer comprises aluminum gallium nitride (AlGaN).

10. The structure of claim 7, wherein at least one high electron mobility transistor (HEMT) further comprises:
    a source contact on the second intermediate layer;
    a drain contact on the second intermediate layer; and
    a gate contact on the first spacer semiconductor layer.

11. The structure of claim 1, further comprising:
    a group III nitride compound barrier layer below the first intermediate layer;
    a group III nitride compound channel layer below the barrier layer;
    a group III nitride compound buffer layer below the channel layer; and
    a group III nitride compound nucleation semiconductor layer below the buffer layer;
    wherein said at least one transistor is at least one double-heterostructure field effect transistor (DHFET).

12. The structure of claim 11, wherein at least one double-heterostructure field effect transistor (DHFET) further comprises:
    a source contact on the second intermediate layer;
    a drain contact on the second intermediate layer; and
    a gate contact on the barrier layer.

13. The structure of claim 1, wherein:
    a thickness of the first intermediate layer is 50-500 angstroms;
    a thickness of the second intermediate layer is 50-500 angstroms;
    a thickness of the etch stop is 100-200 angstroms;
    a thickness of the third intermediate layer is 100-1000 angstroms; and
    a thickness of the fourth intermediate layer is 100-1000 angstroms.

* * * * *